(12) United States Patent
Wang et al.

(10) Patent No.: US 9,383,608 B2
(45) Date of Patent: Jul. 5, 2016

(54) ARRAY SUBSTRATE AND MANUFACTURING METHOD THEREOF

(71) Applicant: Century Technology (Shenzhen) Corporation Limited, Shenzhen (CN)

(72) Inventors: Ming-Tsung Wang, New Taipei (TW); Kuo-Chieh Chi, New Taipei (TW); Qi Xu, Shenzhen (CN); Dan Chen, Shenzhen (CN)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 0 days.

(21) Appl. No.: 14/336,058

(22) Filed: Jul. 21, 2014

(65) Prior Publication Data

US 2015/0021611 A1    Jan. 22, 2015

(30) Foreign Application Priority Data

Jul. 19, 2013  (CN) .......................... 2013 1 0303970

(51) Int. Cl.
*H01L 27/12* (2006.01)
*G02F 1/1339* (2006.01)
*G02F 1/1362* (2006.01)

(52) U.S. Cl.
CPC ............ *G02F 1/1339* (2013.01); *G02F 1/1362* (2013.01); *G02F 1/13394* (2013.01); *H01L 27/1288* (2013.01)

(58) Field of Classification Search
CPC .................................................... H01L 27/1288
USPC ........................................................... 257/72
See application file for complete search history.

(56) References Cited

U.S. PATENT DOCUMENTS

| 2002/0132383 | A1* | 9/2002 | Hiroki | .................. H01L 27/1255 438/17 |
| 2007/0170435 | A1* | 7/2007 | Yoo | .................... G02F 1/133707 257/72 |
| 2014/0300841 | A1* | 10/2014 | Wang | .................. G02F 1/13394 349/43 |

* cited by examiner

*Primary Examiner* — Fernando L Toledo
*Assistant Examiner* — Valerie N Newton
(74) *Attorney, Agent, or Firm* — ScienBiziP, P.C.

(57) ABSTRACT

An array substrate of an LCD includes a substrate, a first wiring layer, a semiconductor film, an insulating layer, a second wiring layer, a passivation layer, a conductive film, and a spacer. The first wiring layer is patterned to a gate line, a gate electrode, and a first laminating layer. The semiconductor film is patterned to a channel layer and a second laminating layer. The second wiring layer is patterned to a source line, a source electrode, a drain electrode, and a third laminating layer. The conductive film is patterned to a pixel electrode and a fourth laminating layer. The spacer is a laminating structure at least includes the first, second, third, fourth laminating layers. A portion of insulating layer overlaps with the first laminating layer, and a portion of passivation layer overlaps with the third laminating layer.

11 Claims, 19 Drawing Sheets

ARRAY SUBSTRATE AND MANUFACTURING METHOD THEREOF

FIELD

The disclosure generally relates to liquid crystal display (LCD) manufacturing technologies.

BACKGROUND

An LCD panel usually includes a color filter substrate, an array substrate opposite to the color filter substrate, and a liquid crystal layer set between the color filter substrate and the array substrate. The array substrate includes a number of spacers formed thereon to hold the color filter substrate with a constant gap. However, currently, a specific exposure step is need to make the spacers, which increases LCD panel cost.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

Figure 1:
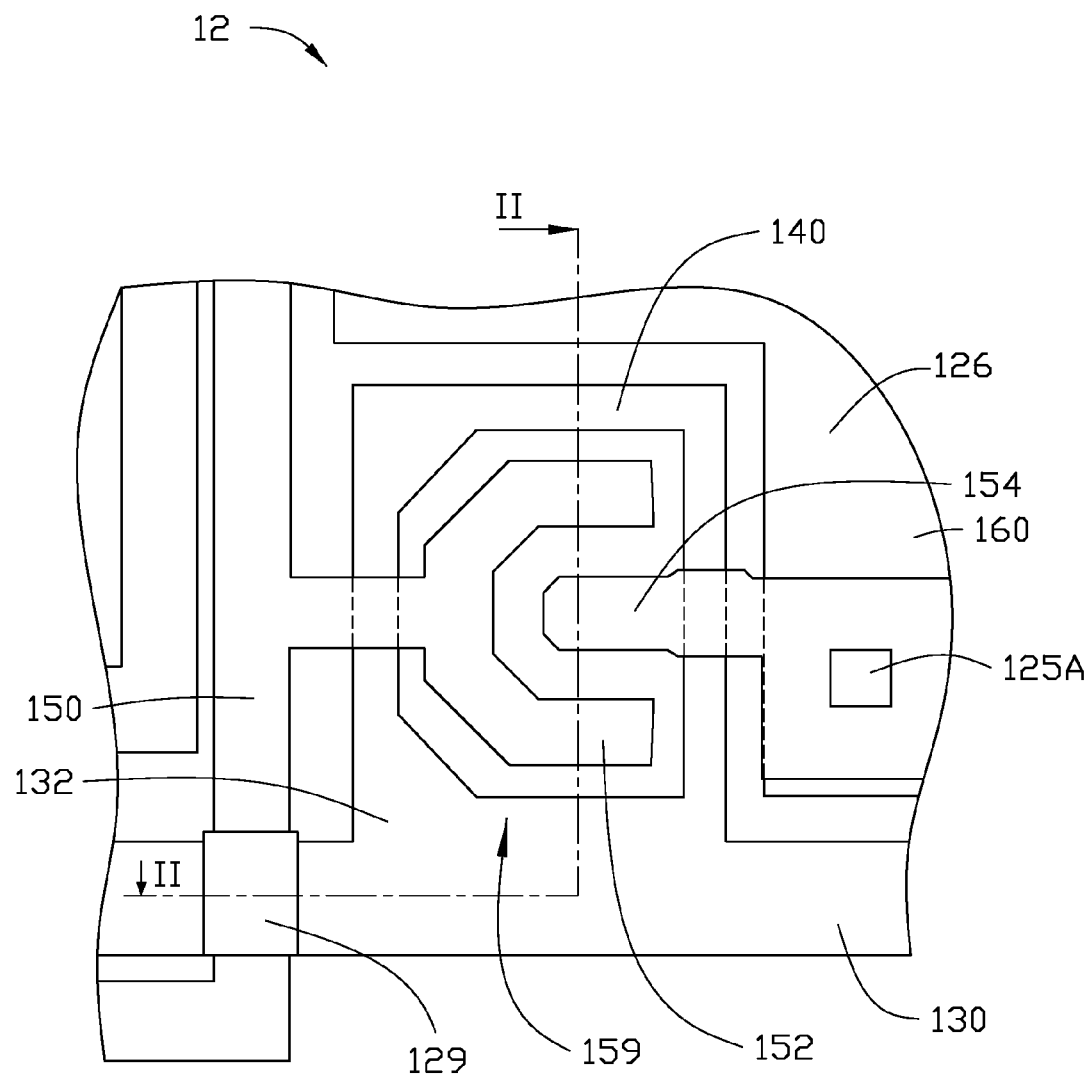
FIG. 1 is a diagrammatic view of an array substrate of a LCD panel of an exemplary embodiment.
Figure 2:
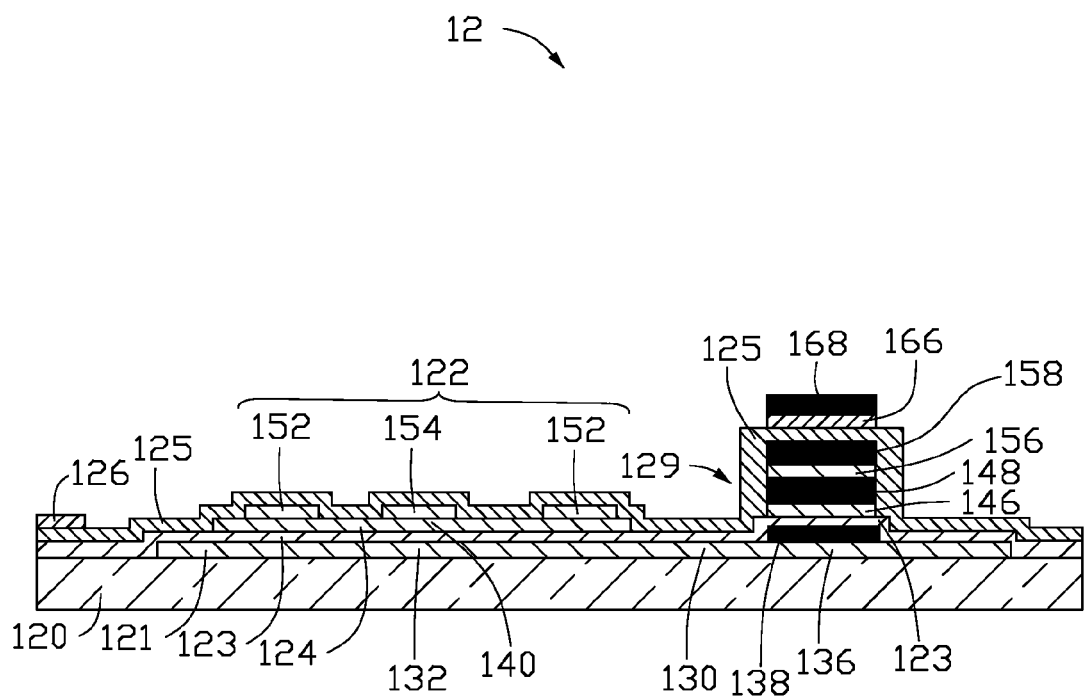
FIG. 2 is a cross-sectional view of the array substrate of FIG. 1, taken along line II-II.

FIG. 1 illustrates an array substrate 12 of a LCD panel of an exemplary embodiment. FIG. 2 illustrates a cross-sectional view of the array substrate 12 of FIG. 1, taken along line II-II. Referring to FIGS. 1 and 2, the array substrate 12 includes a substrate 120, a first wiring layer 121, a second wiring layer 122, an insulating layer 123, a semiconductor film 124, a passivation layer 125, a conductive film 126, and a plurality of spacers 129. The substrate 120 is a transparent substrate, for instance, a glass substrate. The spacer 129 is a laminating structure.

The first wiring layer 121 is set on a surface of the substrate 120 and includes a gate line 130 extending along a first direction, a gate electrode 132 connected to the gate line 130, and a first laminating layer 136. In this embodiment, the gate electrode 132 protrudes from a side of the gate line 130. The first wiring layer 121 is patterned to form the gate line 130, the gate electrode 132, and the first laminating layer 136 by exposing and developing a first photoresist layer 138 formed on the first wiring layer 121. A part of the first photoresist layer 138 covering on the first laminating layer 136 is remained as one layer of the laminating structure of the spacer 129. In this embodiment, the first laminating layer 136 is a first layer of the spacer 129 and the first photoresist 138 is a second layer of the spacer 129.

The insulating layer 123 is formed on the substrate 120 to cover the gate line 130, the gate electrode 132, the first laminating layer 136, and the first photoresist layer 138. The insulating layer 123 is used as a gate insulator. In this embodiment, a part of the insulating layer 123 overlap with the first photoresist layer 138 is a third layer of the spacer 129.

The semiconductor film 124 is formed on a surface of the insulating layer 123. The semiconductor film 124 is patterned to form a channel layer 140 and a second laminating layer 146 by exposing and developing a second photoresist layer 148 on the semiconductor film 124. The channel layer 140 is located corresponding to the gate electrode 132. The second laminating layer 146 is stacked with the first photoresist layer 138. A part of the second photoresist layer 148 covering the second laminating layer 146 remains as one layer of the laminating structure of the spacer 129. In this embodiment, the second laminating layer 146 is a fourth layer of the spacer 129 and the second photoresist layer 148 is a fifth layer of the spacer 129.

The second wiring layer 122 is formed on the semiconductor film 124 and the insulating layer 123. The second wiring layer 122 is electrically isolated from the first wiring layer 121. The second wiring layer 122 is patterned to form a source line 150, a source electrode 152, a drain electrode 154, and a third laminating layer 156 by exposing and developing a third photoresist layer 158 on the second wiring layer 122. The source electrode 152 and the drain electrode 154 overlap the semiconductor film 124. The third laminating layer 156 is stacked with the second photoresist layer 148. A part of the third photoresist layer 158 covering the third laminating layer 156 remains as one layer of the laminating structure of the spacer 129. In this embodiment, the third laminating layer 156 is a sixth layer of the spacer 129 and the third photoresist layer 158 is a seventh layer of the spacer 129.

The source line 150 extends along a second direction different from the first direction. The source line 150 crosses with the gate line 130 to define a pixel area. The source electrode 152 is connected to the source line 150. The source electrode 152 is electrical connected to the drain electrode 154 via the channel layer 140. The source electrode 152, the drain electrode 154, and the channel layer 140 define as a thin film transistor (TFT) 159. In this embodiment, the thin film transistor 159 is located at a corner where the source line 150 crosses the gate line 130.

The passivation layer 125 is formed on the substrate 120 to cover the insulating layer 123, the semiconductor layer 124, the second wiring layer 122, and the third photoresist layer 158 formed on the third laminating layer 156. In this embodiment, a part of the passivation layer 125 covering the third photoresist layer 158 is an eighth layer of the spacer 129.

The conductive film 126 is formed on the passivation layer 125. The conductive film 126 is patterned to form a pixel electrode 160 and a fourth laminating layer 166 by exposing and developing a fourth photoresist layer 168 covering the conductive film 126. The pixel electrode 160 is electrically connected to the drain electrode 154 via a connecting through hole 125A defined in the passivation layer 125. A part of the fourth photoresist layer 168 covering the fourth laminating layer 166 remains as one layer of the laminating structure of the spacer 129. In this embodiment, the fourth laminating layer 166 is a ninth layer of the spacer 129 and the fourth photoresist layer 168 is a tenth layer of the spacer 129.

It is understood that a laminating sequence of layers of the spacer 129 can be changed according to a priority of manufacturing steps of the first wiring layer 121, the second wiring layer 122, the insulating layer 123, the semiconductor film 124, the passivation film 125, and the conductive film 126. The first photoresist layer 138, the second photoresist layer 148, the third photoresist layer 158, and/or the fourth photoresist layer 168 can be omitted from the laminating structure of the spacer 129.

Figure 3:
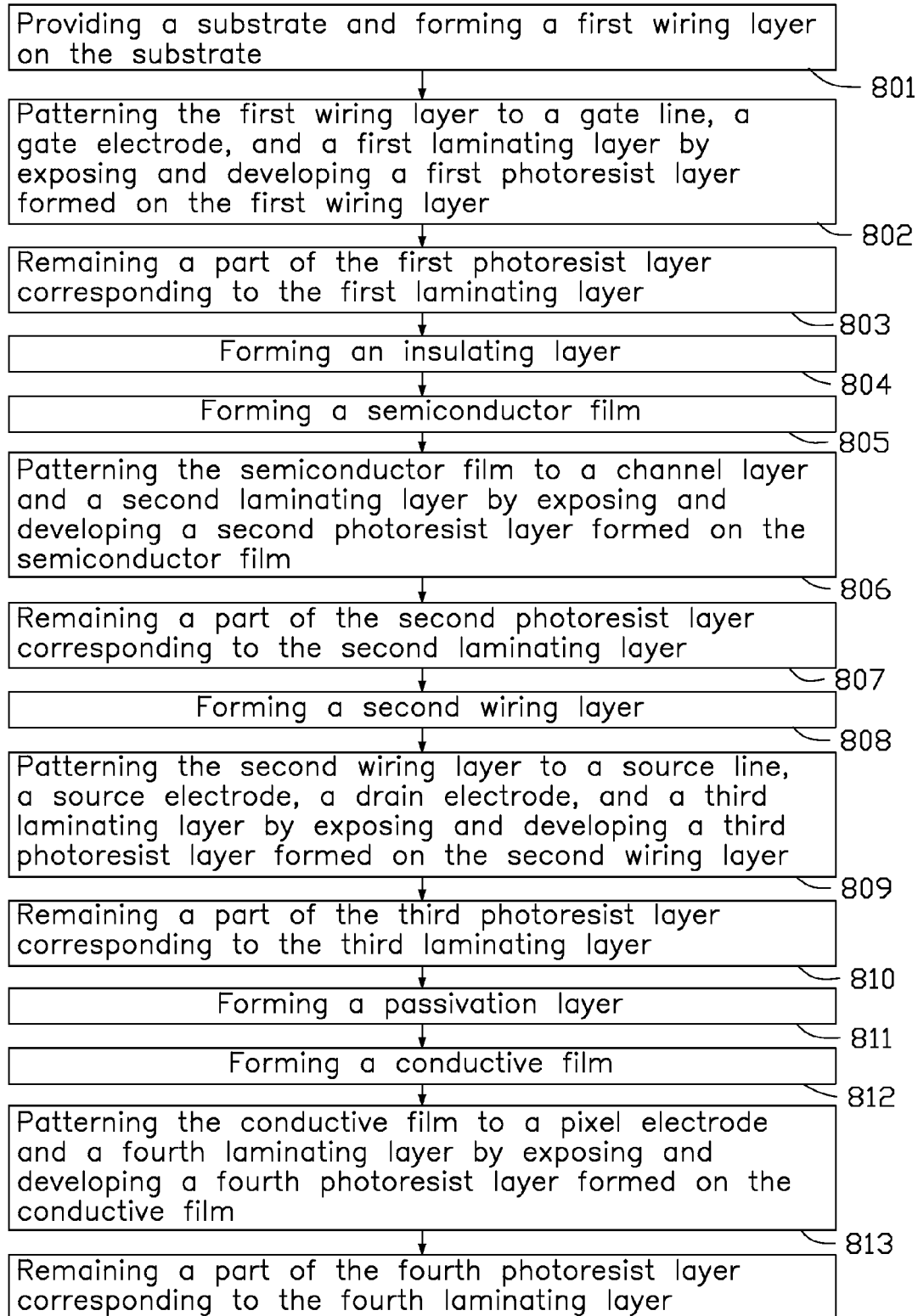
FIG. 3 is a flowchart of an exemplary embodiment of an array substrate manufacturing method.

FIG. 3 is a flowchart of an exemplary embodiment of an array substrate manufacturing method. FIGS. 4-19 illustrates cross-sectional views corresponding to blocks 801-814, respectively, of FIG. 3. The spacer 129 of the array substrate 12 is formed at the same time with the TFT 159 and the pixel electrode 160 of the array substrate 12. In this embodiment, the TFT 159 is a bottom gate type TFT. It is understood that, in the other embodiments, the TFT 159 can be different types of TFTs, for instance, a top gate type TFT. Correspondingly, a priority of the manufacturing steps can be changed according to the structure of the TFT 159.

Figure 4:
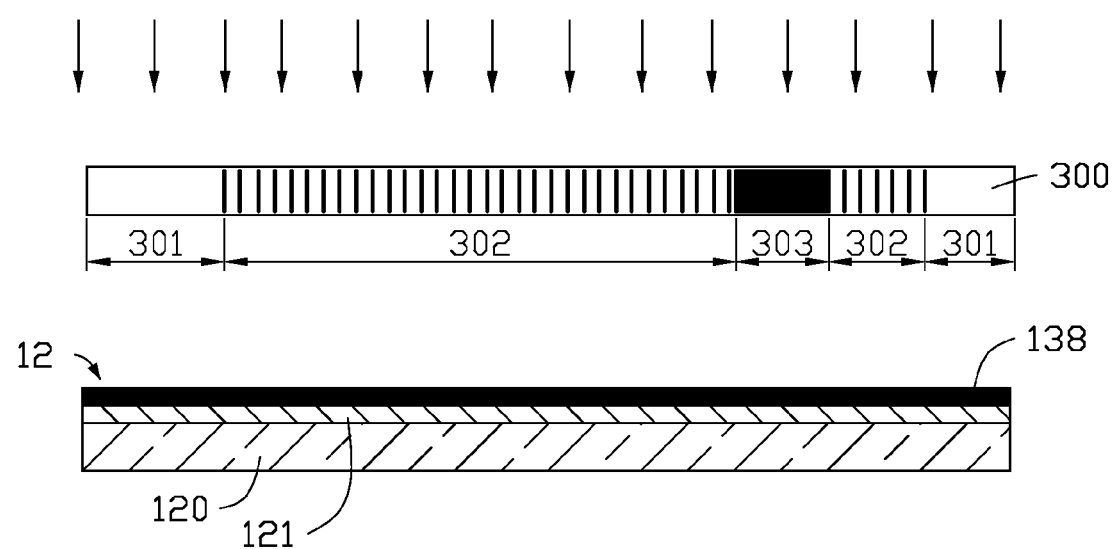
FIGS. 4-19 are cross-sectional views corresponding to blocks 801-814, respectively, of FIG. 3.

In block 801, referring also to FIG. 4, the substrate 120 is provided and the first wiring layer 121 is formed on the substrate 120. The substrate 120 can be made of an insulative material, for example, glass, quartz, or a ceramic. The first wiring layer 121 can be made of a conductive material, for example, aluminum, molybdenum, chromium, tantalum, or copper.

In block 802, the first photoresist layer 138 is formed on the first wiring layer 121 to pattern the first wiring layer 121. A first mask 300 is placed above the first photoresist layer 138. The first mask 300 is a gray tone mask and includes a plurality of first areas 301, two second areas 302, and a third areas 303. Transmittances of the first areas 301, the second areas 302, and the third areas 303 are gradually decreased. In this embodiment, the third areas 303 are opaque, the first areas 301 of the first mask 300 are transparent, and the second areas 302 allow a portion of light to pass through. The second areas 302 are respectively aligned with positions of the gate line 130 and the gate electrode 132 (see FIG. 1). The third areas 303 are is aligned with a position of the spacer 129 (see FIG. 1). The first areas 301 are aligned with the remaining portion of the array substrate 12. Ultraviolet light passes through the first mask 300 to expose the first photoresist layer 138. Because the transmittances of the first areas 301, the second areas 302, and the third areas 303 are different from each other, different parts of the first photoresist layer 138 aligned with the first areas 301, the second areas 302, and the third areas 303 are exposed in different intensity.

Figure 5:
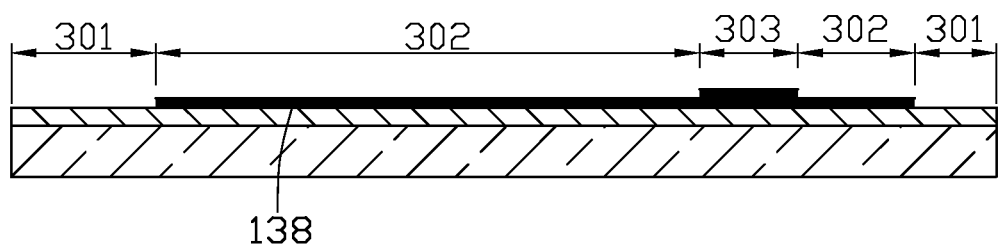

Referring to FIG. 5, the first photoresist layer 138 is developed. A plurality of first parts of the first photoresist layer 138 aligned with the first areas are totally removed. Two second parts of the first photoresist layer 138 aligned with the two second areas 302 are partially removed. A third part of the first photoresist layer 138 aligned with the third area 303 remains complete. A thickness of the third part of the first photoresist layer 138 aligned to the third area 303 is greater than a thickness of the second parts of the first photoresist layer 138 aligned to the second areas 302.

Figure 6:
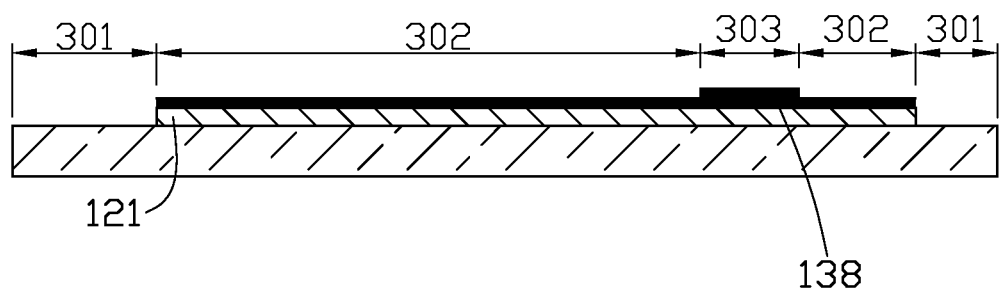

Referring to FIG. 6, a part of the first wiring layer 121 uncovered by the first photoresist layer 138 is etched away. That is, the part of the first wiring layer 121 aligned to the first areas 301 is etched away.

Figure 7:
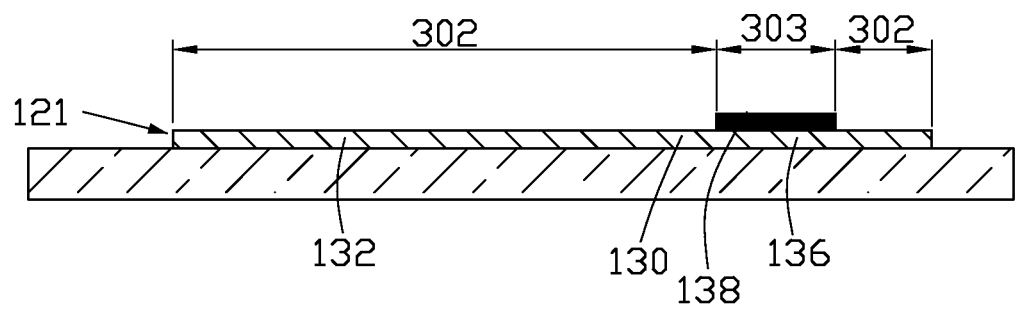

In block 803, referring to FIG. 7, the first photoresist layer 138 is etched until the second parts of the first photoresist layer 138 aligned with the second areas 302 are totally removed. Because the thickness of the third part of the first photoresist layer 138 aligned with the third areas 303 is greater than the thickness of the second parts of the first photoresist layer 138 aligned with the second areas 302 of the first mask 300, the third part of the first photoresist layer 138 aligned with the third area 303 of the first mask 300 remains when the second parts of the first photoresist layer 138 aligned with the second areas 302 of the first mask 300 are totally removed. A part of the first wiring layer 121 uncovered by the first photoresist layer 138 is used as the gate line 130 and the gate electrode 132. The other part of the first wiring layer 121 covered by the remaining third part of the first photoresist layer 138 is used as the first laminating layer 136 of the spacer 129.

Figure 8:
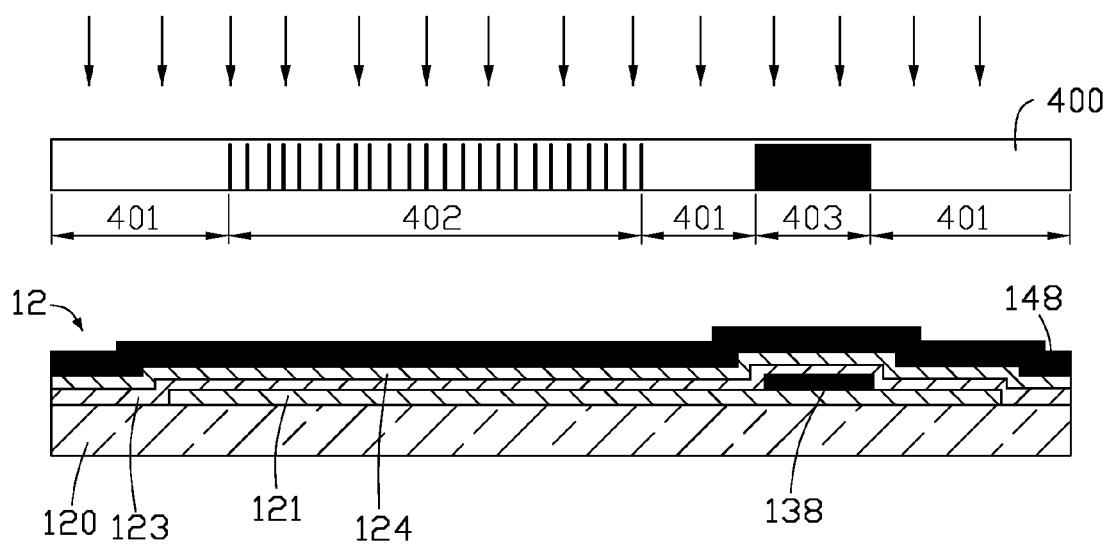

In block 804, also referring to FIG. 8, the insulating layer 123 is formed on the substrate 120 to cover the first wiring layer 121 and the remaining third part of the first photoresist layer 138. A part of the insulating layer 123 covering the remaining third part of the first photoresist layer 138 is used as one layer of the laminating structure of the spacer 129 (see FIG. 2).

In block 805, the semiconductor film 124 is formed on the insulating layer 123. The semiconductor film 124 can be made of a metal oxide semiconductor.

In block 806, the second photoresist layer 148 is formed on the semiconductor film 124 to pattern the semiconductor film 124. A second mask 400 is placed above the second photoresist layer 148. The second mask 400 is a gray tone mask and includes a number of first areas 401, a second area 402, and a third area 403. Transmittances of the first areas 401, the second area 402, and the third area 403 are gradually decreased. In this embodiment, the third area 403 is opaque, the first areas 401 are transparent, and the second area 402 allows a portion of light to pass through. The second area 402 is aligned with a position of the channel layer 140 (see FIG. 1). The third area 403 is aligned with the position of the spacer 129 (see FIG. 1). The first areas 401 are aligned with the remaining portion of the array substrate 12. Ultraviolet light passes through the second mask 400 to expose the second photoresist layer 148.

Figure 9:
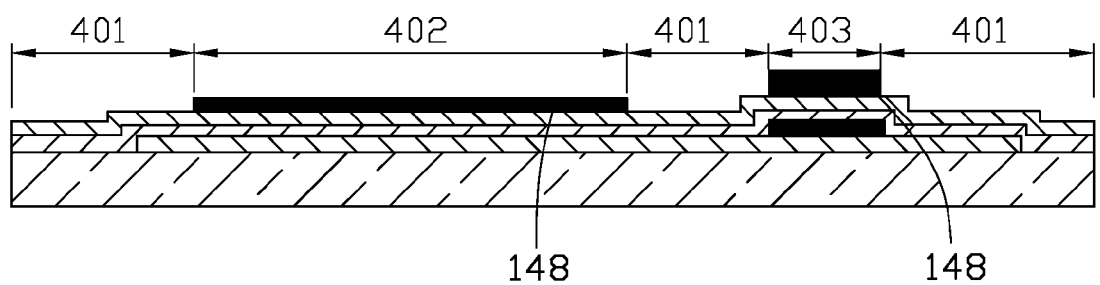

Referring to FIG. 9, the second photoresist layer 148 is developed. A number of first parts of the second photoresist layer 148 aligned with the first areas 401 are totally removed. A second part of the second photoresist layer 148 aligned with the second area 402 of the second mask 400 is partially removed. A third part of the second photoresist layer 148 aligned to the third area 403 remains complete. A thickness of the third part of the second photoresist layer 148 aligned with the third area 403 is greater than a thickness of the second part of the second photoresist layer 148 aligned with the second area 402.

Figure 10:
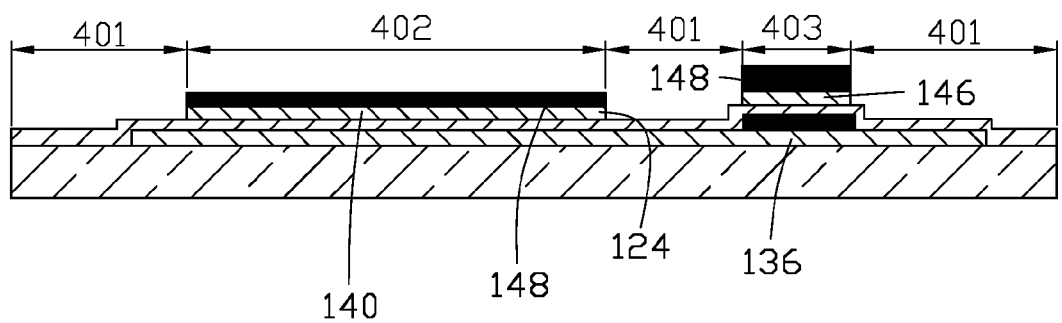

Referring to FIG. 10, a part of the semiconductor film 124 uncovered by the second photoresist layer 148 is etched away. That is, the part of the semiconductor film 124 aligned with the first area 401 is etched away. A part of the semiconductor film 124 aligned with the second area 402 is patterned to form the channel layer 140. A part of the semiconductor film 124 aligned with the third area 403 is patterned to form the second laminating layer 146 of the spacer 129. The second laminating layer 146 is stacked with the first laminating 136 layer.

Figure 11:
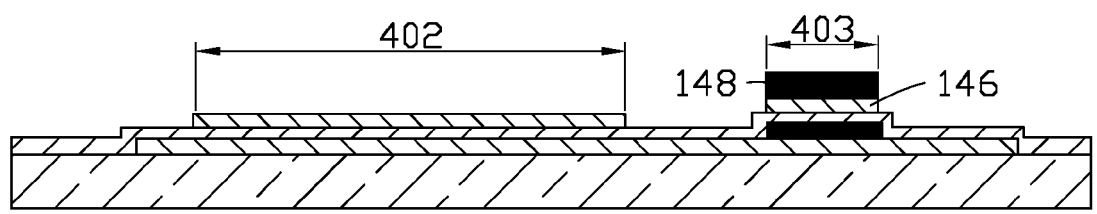

In block 807, referring also to FIG. 11, the second photoresist layer 148 is etched until the second part of the second photoresist layer 148 aligned with the second area 402 is totally removed. Because the thickness of the third part of the second photoresist layer 148 aligned to the third area 403 is greater than the thickness of the second part of the second photoresist layer 148 aligned with the second area 402, the third part of the second photoresist layer 148 aligned with the third area 403 remains when the second part of the first photoresist layer 148 aligned with the second area 402 is totally removed. The remained third part of the second photoresist layer 148 is used as one layer of the laminating structure of the spacer 129 (see FIG. 2).

Figure 12:
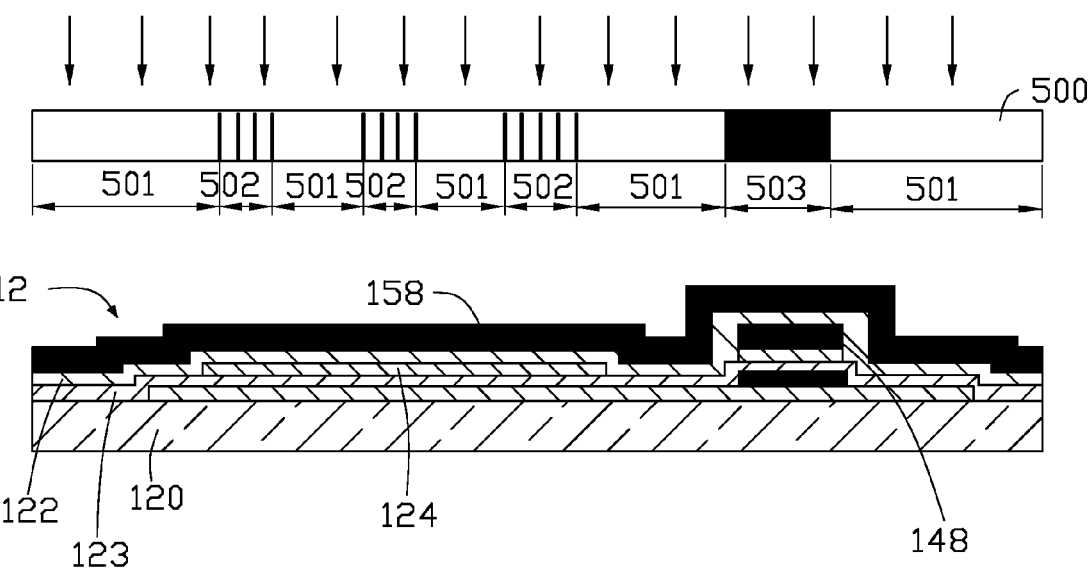

Referring to FIG. 12, in block 808, the second wiring layer 122 is formed on the substrate 120 to cover the insulating layer 123, the semiconductor film 124, and the second photoresist layer 148.

In block 809, the third photoresist layer 158 is formed on the second wiring layer 122 to pattern the second wiring layer 122. A third mask 500 is placed above the third photoresist layer 158. The third mask 500 is a gray tone mask and includes a plurality of first areas 501, three second areas 502, and a third area 503. Transmittances of the first areas 501, the second areas 502, and the third area 503 are gradually decreased. In this embodiment, the third area 503 is opaque, the first areas 501 are transparent, and the second areas 502 allow a portion of light to pass through. The three second areas 502 are respectively aligned with positions of two branches of the source electrode 152 and the drain electrode 154 (see FIG. 1). The third area 503 is aligned with the position of the spacer 129. The first areas 501 are aligned with the remaining portion of the array substrate 12. Ultraviolet light passes through the third mask 500 to expose the third photoresist layer 158.

Figure 13:
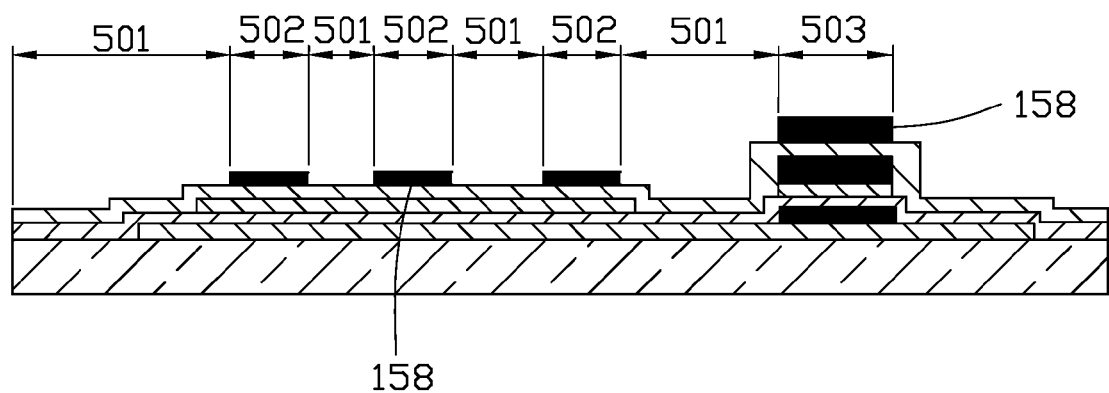

Referring to FIG. 13, the third photoresist layer 158 is developed. A plurality of first parts of the third photoresist layer 158 aligned with the first areas 501 are totally removed. Three second parts of the third photoresist layer 158 aligned with the three second areas 502 are partially removed. A third part of the first photoresist layer 158 aligned with the third area 503 remains complete. A thickness of the third part of the third photoresist layer 158 aligned with the third area 503 is greater than a thickness of the second parts of the third photoresist layer 158 aligned with the second areas 502.

Figure 14:
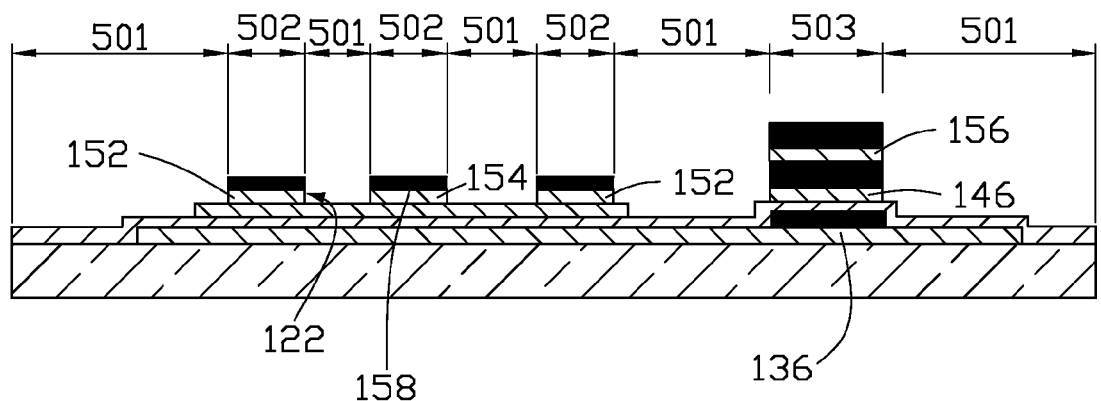

Referring to FIG. 14, a part of the second wiring layer 122 uncovered by the third photoresist layer 158 is etched away. That is, the part of the second wiring layer 122 aligned with the first areas 501 is etched away. A portion of the second wiring layer 122 aligned with the second areas 502 is patterned to form the source line 150 (see FIG. 1), the source electrode 152, and the drain electrode 154. A portion of the second wiring layer 122 aligned with the third area 503 is patterned to form the third laminating layer 156 of the spacer 129. The third laminating layer 156 is stacked with the first laminating layer 146 and the second laminating layer 136.

Figure 15:
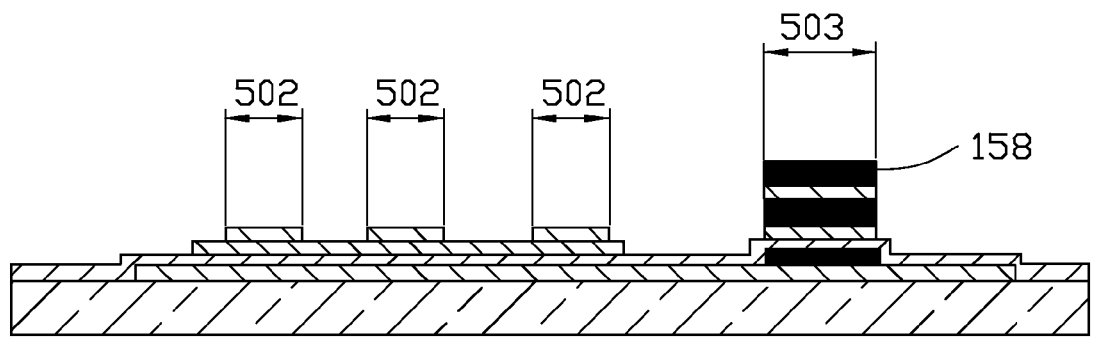

In block 810, referring also to FIG. 15, the third photoresist layer 158 is etched until the second parts of the third photoresist layer 158 aligned with the second areas 502 are totally removed. Because the thickness of the third part of the third photoresist layer 158 aligned with the third area 503 is greater than the thickness of the second parts of the third photoresist layer 158 aligned with the second areas 502, the third part of the third photoresist layer 158 aligned with the third area 503 remains when the second parts of the third photoresist layer 158 aligned with the second areas 502 is totally removed. The remaining third part of the third photoresist layer 158 is used as one layer of the laminating structure of the spacer 129 (see FIG. 2).

Figure 16:
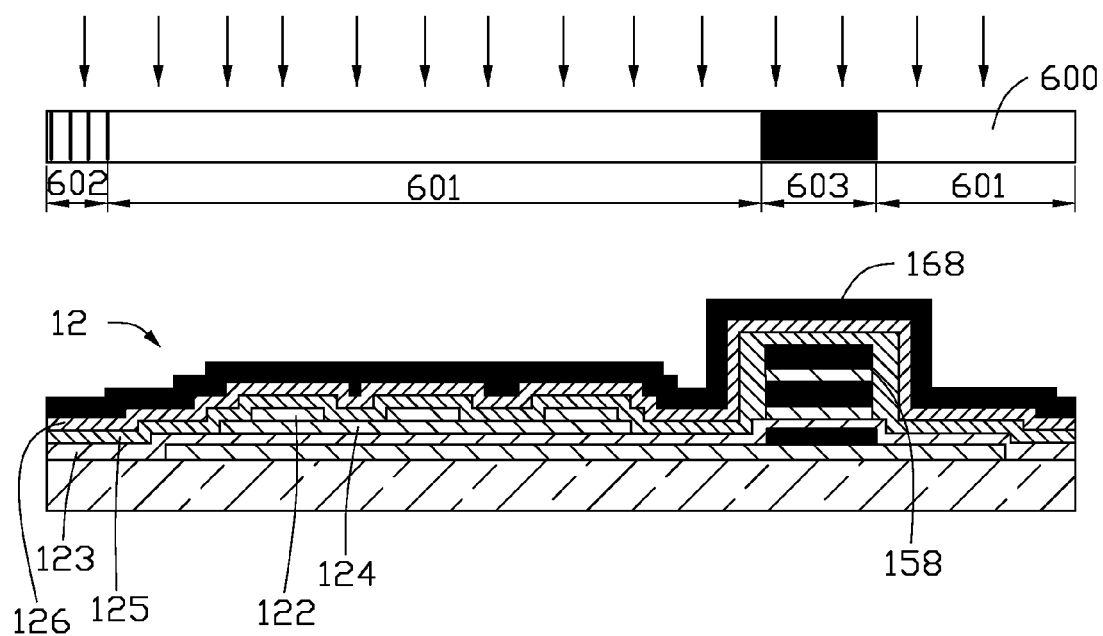

Referring to FIG. 16, in block 811, the passivation layer 125 is formed to cover the insulating layer 123, the semiconductor film 124, the second wiring layer 122, and the third photoresist layer 158. A part of the passivation layer 125 covering on the remaining third part of the third photoresist layer 158 is used as one layer of the laminating structure of the spacer 129 (see FIG. 2).

In block 812, a conductive film 126 is formed on the passivation layer 125. In this embodiment, the conductive film 126 is made of indium tin oxide (ITO).

In block 813, the fourth photoresist layer 168 is formed on the conductive film 126 to pattern the conductive film 126. A fourth mask 600 is placed above the fourth photoresist layer 168. The fourth mask 600 is a gray tone mask and includes a plurality of first areas 601, a second area 602, and a third area 603. Transmittances of the first areas 601, the second area 602, and the third area 603 are gradually decreased. In this embodiment, the third area 603 is opaque, the first areas 601 are transparent, and the second area 602 allows a portion of light to pass through. The second area 602 is aligned with a position of the pixel electrode 160 (see FIG. 1). The third area 603 is aligned with the position of the spacer 129 (see FIG. 1). The first areas 601 are aligned with the remaining portion of the array substrate 12. Ultraviolet light passes through the fourth mask 600 to expose the fourth photoresist layer 168.

Figure 17:
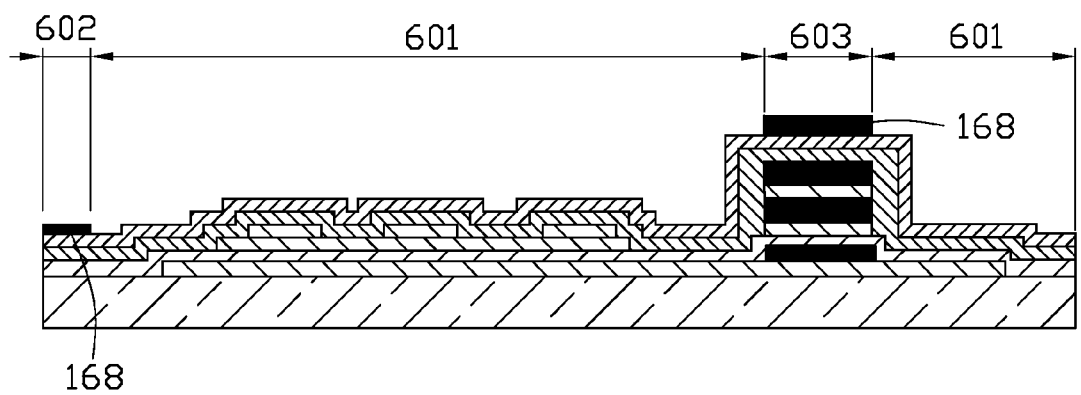

Referring to FIG. 17, the fourth photoresist layer 168 is developed. A number of first parts of the fourth photoresist layer 168 aligned with the first areas 601 are totally removed. A second part of the fourth photoresist layer 168 aligned with the second area 602 is partially removed. A third part of the fourth photoresist layer 168 aligned with the third area 603 remains complete. A thickness of the third part of the fourth photoresist layer 168 aligned with the third area 603 is greater than a thickness of the second part of the fourth photoresist layer 168 aligned with the second area 602.

Figure 18:
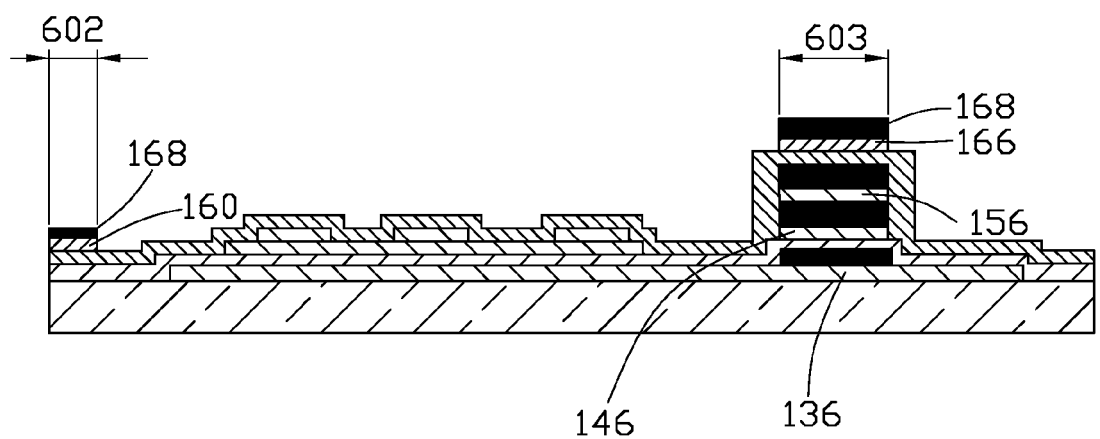

Referring to FIG. 18, a portion of the conductive film 126 uncovered by the fourth photoresist layer 168 is etched away. That is, the portion of the conductive film 126 aligned to the first area 601 is etched away. A portion of the conductive film 126 aligned with the second area 602 is patterned to form the pixel electrode 160. A portion of conductive film 126 aligned with the third area 603 is patterned to form the fourth laminating layer 166 of the spacer 129 (see FIG. 2). The fourth laminating layer 166 is stacked with the first laminating layer 136, the second laminating layer 146, and the third laminating layer 156.

Figure 19:
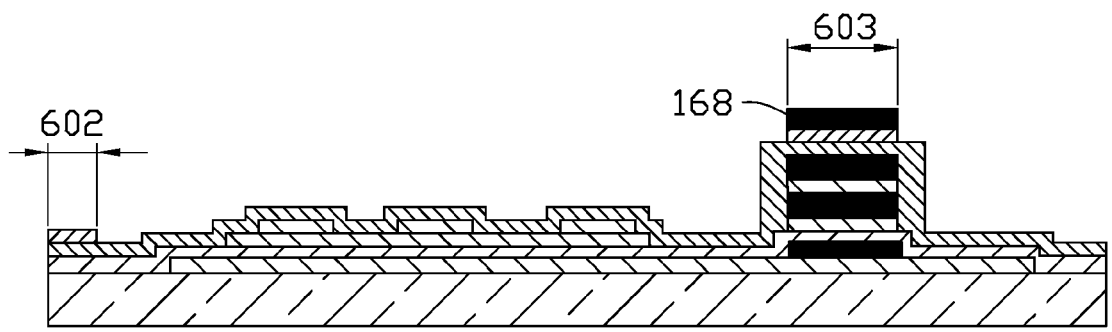

In block 814, referring also to FIG. 19, the fourth photoresist layer 168 is etched until the second part of the fourth photoresist layer 168 aligned with the second area 602 is totally removed. Because the thickness of the third part of the fourth photoresist layer 168 aligned with the third area 603 is greater than the thickness of the second part of the fourth photoresist layer 168 aligned with the second area 602, the third part of the fourth photoresist layer 168 aligned with the third area 603 remains when the second part of the fourth photoresist layer 168 aligned with the second area 602 is totally removed. The remained third part of the fourth photoresist layer 168 is used as one layer of the laminating structure of the spacer 129 (see FIG. 2).

It is believed that the present embodiments and their advantages will be understood from the foregoing description, and it will be apparent that various changes may be made thereto without departing from the scope of the disclosure or sacrificing all of its material advantages, the examples hereinbefore described merely being preferred or exemplary embodiments.

What is claimed is:

1. An array of a liquid crystal display panel comprising:
a substrate;
a first wiring layer comprising a gate line, and a gate electrode connected to the gate line and a first laminating layer;
a semiconductor film comprising a channel layer aligned with the gate electrode and a second laminating layer stacked with the first laminating layer;
an insulating layer formed between the first wiring layer and the semiconductor film;
a second wiring layer comprising a source line, a source electrode connected to the source line, a drain electrode connected to the source electrode via the channel layer, and a third laminating layer stacked with the first laminating layer and the second laminating layer in that order;

a passivation layer covering the insulating layer, the semiconductor layer, and the second wiring layer;

a conductive film comprising a pixel electrode connected to the drain electrode and a fourth laminating layer stacked with the first laminating layer, the second laminating layer, and the third laminating layer in that order; and a spacer formed to be a laminating structure comprising the first laminating layer, the second laminating layer, the third laminating layer, and the fourth laminating layer, and configured to hold a color filter substrate with a constant gap;

wherein a portion of the insulating layer is configured to overlap with the first laminating layer and being one layer of the laminating structure of the spacer, and a portion of the passivation layer is configured to overlap with the third laminating layer and the fourth laminating layer, the part of the passivation layer being used as the other one layer of the laminating structure of the spacer.

2. The array substrate of claim 1, wherein the laminating structure of the spacer further comprises a portion of a first photoresist layer remaining between the first laminating layer and the insulating layer, and the first wiring layer is patterned to form the gate line, the gate electrode, and the first laminating layer by exposing and developing the first photoresist layer.

3. The array substrate of claim 1, wherein the laminating structure of the spacer further comprises a portion of a second photoresist layer remaining between the second laminating layer and the third laminating layer, and the semiconductor film is patterned to form the channel layer and the second laminating layer by exposing and developing the second photoresist layer.

4. The array substrate of claim 1, wherein the laminating structure of the spacer further comprises a portion of a third photoresist layer remaining between the third laminating layer and the passivation layer, and the second wiring layer is patterned to form the source line, the source electrode, a drain electrode, and a third laminating layer by exposing and developing the third photoresist layer.

5. The array substrate of claim 1, wherein the laminating structure of the spacer further comprises a part of a fourth photoresist layer remained on the fourth laminating layer, and the conductive film is patterned to form the pixel electrode and the fourth laminating layer by exposing and developing the fourth photoresist layer.

6. The array substrate of claim 1, wherein the second wiring layer is electrical isolated from the first wiring layer.

7. The array substrate of claim 1, wherein the channel layer is located corresponding to the gate electrode, the source electrode is electrical connected to the drain electrode via the channel layer, and the source electrode, the drain electrode, and the channel layer are defined as a thin film transistor.

8. The array substrate of claim 1, wherein the semiconductor film is made of a metal oxide semiconductor.

9. The array substrate of claim 1, wherein the first wiring layer is made of a material selected from the group consisting of aluminum, molybdenum, chromium, tantalum, and copper.

10. The array substrate of claim 1, wherein the pixel electrode is electrical connected to the drain electrode via a connecting through hole defined in the passivation layer.

11. The array substrate of claim 1, wherein the first laminating layer and the gate electrode are simultaneously formed under a same first mask with different transmittances on different areas; the second laminating layer and the channel layer are simultaneously formed under a same second mask with different transmittances on different areas; the third laminating layer and the drain electrode are simultaneously formed under a same third mask with different transmittances on different areas.

* * * * *